United States Patent [19]

Schmidt et al.

[11] Patent Number: 5,005,016
[45] Date of Patent: Apr. 2, 1991

[54] HYBRID PHASE-LOCKED LOOP

[75] Inventors: Konrad Schmidt, Ellingen; Ralf Kramer, Nuremburg, both of Fed. Rep. of Germany

[73] Assignee: U.S. Philips Corporation, New York, N.Y.

[21] Appl. No.: 500,447

[22] Filed: Mar. 27, 1990

[30] Foreign Application Priority Data

Apr. 3, 1989 [DE] Fed. Rep. of Germany ....... 3910703

[51] Int. Cl.$^5$ .............................................. H03M 1/00
[52] U.S. Cl. ..................................... 341/142; 341/111; 341/118; 341/155; 341/156; 341/126
[58] Field of Search ............... 341/111, 118, 142, 155, 341/156, 126

[56] References Cited

U.S. PATENT DOCUMENTS 4,791,498 12/1988 Yoshihiro ............................... 358/35
4,841,379 6/1989 Akiyama ............................... 358/337
4,847,569 7/1989 Dudziak et al. ..................... 341/118

Primary Examiner—William M. Shoop, Jr.
Assistant Examiner—Nancy Le
Attorney, Agent, or Firm—Jack D. Slobod

[57] ABSTRACT

The invention relates to a phase-locked loop comprising a phase detector (PD), an analog-to-digital converter (ADC), a loop filter (LF), a digital-to-analog converter (DAC) and a voltage-controlled oscillator (VCO). The phase jitter that occurs in such a hybrid phase-locked loop is reduced without enhancing the requirements as to the resolution of the digital-to-analog converter (DAC), in that a fractionizer (FR) is inserted after the loop filter (LF) that is operating at a first clock (TL), which fractionizer produces a main value (HW) and a residual value (RW), and the sum (SW) of the main value (HW) and a correction bit (KB) derived from the residual value (RW) is applied to the digital-to-analog converter (DAC) that is operating at a second clock (TA).

20 Claims, 1 Drawing Sheet

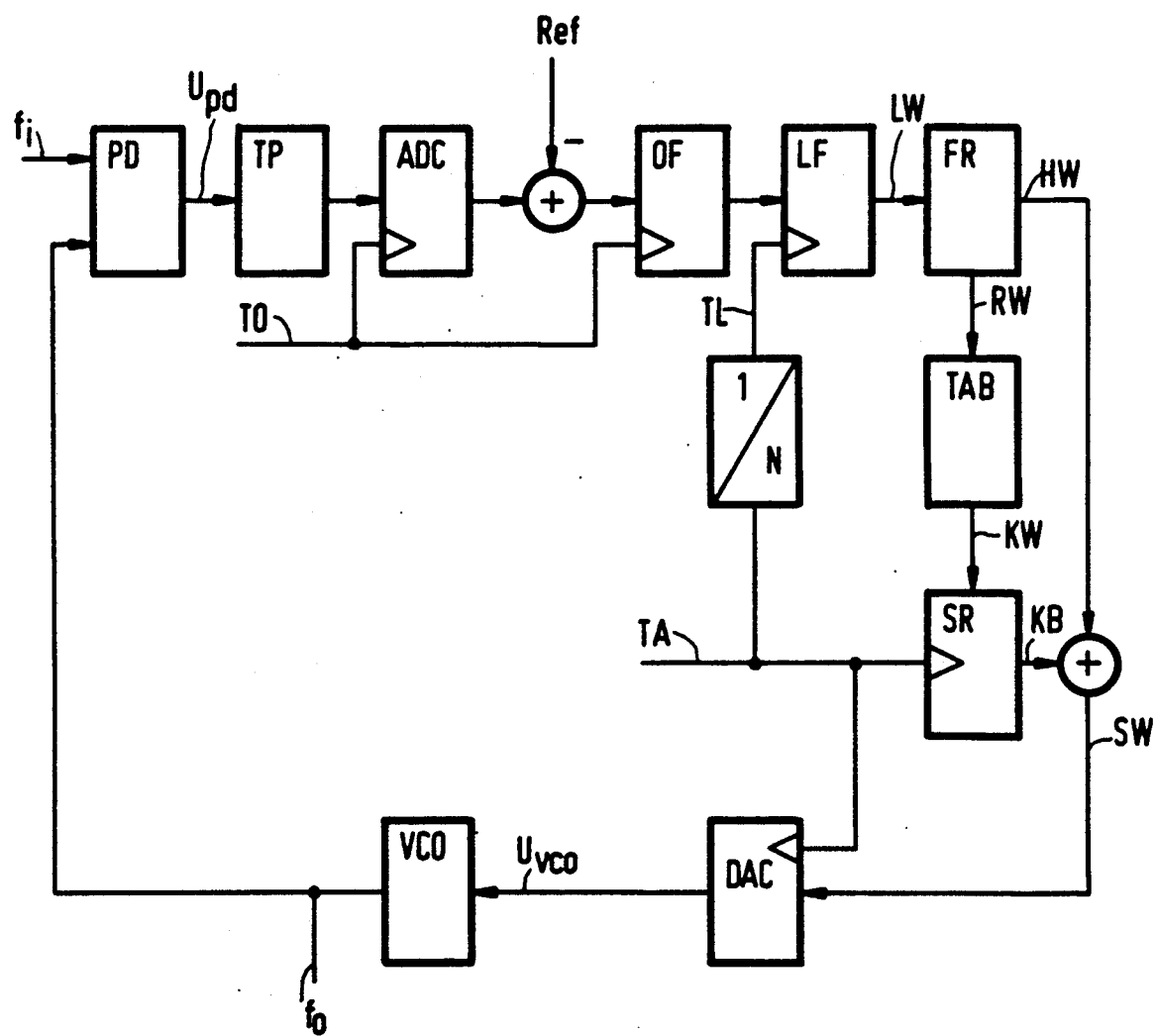

HYBRID PHASE-LOCKED LOOP

The invention relates to a phase-locked loop comprising a phase detector, an analog-to-digital converter, a digital loop filter, a digital-to-analog converter and a voltage-controlled oscillator.

Such a phase-locked loop (PLL) is known, for example from the article entitled "On Optimum Digital Phase-Locked Loops", by S. C. Gupta in IEEE Trans. Commun. Tech., Vo. COM-16, pp. 340-344, Apr. 1968. Such phase-locked loops are denoted as hybrid phase-locked loops since both analog and digital components are utilized. Such phase-locked loops are, for example, suitable for the clock recovery of extremely stable clocks of digital transmission networks in communication technology. The phase-locked loop basically comprises a voltage-controlled oscillator (VCO), a phase detector (PD), an analog-to-digital-to-analog converter. The phase detector compares the phase position of a signal produced by the voltage-controlled oscillator with the phase position of an input signal and generates a control voltage that adjusts the oscillator until the phase difference is minimal or reaches a predetermined set value.

The frequency of the oscillator of a hybrid phase-locked loop can be shifted only in discrete steps of which the size depends on the resolution of the digital-to-analog converter, that is to say, on the digital value (bit) having the least significance (LSB). This entails that the frequency of the output signal of the phase-locked loop always differs by a certain value from the frequency of the input signal of the phase-locked loop. When the phase-locked loop has locked and then the input frequency shows an instability, the digital-to-analog converter steps by at least one LSB. This results in phase jitter of the output signal which may cause problems. If, for example, two similar systems have to be phase-locked, this will be rendered difficult or even impossible as a result of the phase jitter. A further problem will occur with drop-outs of the input frequency. The oscillator will then continue to oscillate at its instantaneous frequency which differs more or less from a reference frequency depending on the magnitude of the frequency difference that occurred last.

In order to minimize the phase jitter at the output of the oscillator, the resolution of the analog-to-digital converter is to be selected such that the product of the change by one LSB at the output of the analog-to-digital converter and the proportionality factor of the loop filter causes exactly a change by one LSB of the digital-to-analog converter. From this it will be evident that the phase jitter of a hybrid phase-locked loop arranged thus can be further reduced only if the resolution of both the digital-to-analog converter and that of the analog-to-digital converter is enhanced. However, at the same time this will entail additional circuitry and thus higher cost.

It is an object of the invention to provide a phase-locked loop of the type mentioned in the opening paragraph by means of which the phase jitter can be reduced without enhancing the requirements as to the resolution of the digital-to-analog converter.

According to the invention, this object is achieved by means of a phase-locked loop of the type mentioned in the opening paragraph in that a fractionizer is inserted after the digital loop filter that is operating at a first clock, which fractionizer produces a main value and a residual value, and the sum of the main value and a correction bit derived from the residual value is applied to the digital-to-analog converter that is operating at a second clock.

Advantageous embodiments are contained in the sub-claims.

In the sequel the invention will be further explained with reference to an exemplary embodiment shown in the FIGURE.

The FIGURE shows a hybrid phase-locked loop.

The phase-locked loop represented in the FIGURE comprises a phase detector PD to which is applied an external signal at a normal frequency $f_i$ and a signal produced by a voltage-controlled oscillator VCO at a frequency $f_o$. The phase detector PD compares the phase relationship of the signals at frequencies $f_i$, $f_o$ and supplies a voltage $U_{pd}$ that depends on the phase shift. The voltage $U_{pd}$ is applied to an analog-to-digital converter ADC through a low-pass filter TP which filters out disturbing frequency portions. After the comparator for comparison to a reference value Ref an oversample filter OF is inserted in the phase-locked loop which filter causes and enhanced resolution. The analog-to-digital converter ADC and the oversample filter OF operate at a common third clock TO. The output values of the oversample filter OF are applied to a digital loop filter LF which is realized in software (i.e. by means of a suitably programmed digital signal processor) and operates at a first clock TL. The computed output values LW of the loop filter are split up by means of a 'fractionizer' FR into a main value HW having a word length equal to the bit width of the digital-to-analog converter and a residual value RW. The residual value RW addresses a table look-up memory TAB and a corresponding correction value KW is selected therefrom. The individual bits of the correction value KW are loaded in parallel into the shift register SR at the first clock TL. A correction bit KB of the correction value KW is read as an LSB from the shift register at a second clock TA and subsequently added to the main value HW to produce a sum value SW. The sum value SW is subsequently applied to the digital-to-analog converter DAC. An analog signal $U_{vco}$ at the output of the digital-to-analog converter DAC is applied to the input of the voltage-controlled oscillator VCO which, in response to that signals produces the signal having the frequency $f_o$.

In the hybrid phase-locked loop shown in the FIGURE it is assumed that both the analog-to-digital converter ADC and the digital-to-analog converter DAC have an accuracy of at least half of LSB (no missing code). The word length of the main value HW corresponds with the bit width of the digital-to-analog converter DAC, whereas the correction value KW has a word length N corresponding with the ratio of the second clock TA of the digital-to-analog converter to the first clock TL of the loop filter LF.

As regards the signals at the input of the phase detector PD it is required that they are square wave signals in the exemplary embodiment shown in the FIGURE. As a result of the low-pass filtering TP of the voltage $U_{pd}$ at the output of the phase detector PD a mean direct voltage value is produced which is converted into a digital value by an analog-to-digital converter ADC. In the exemplary embodiment a 12-bit analog-to-digital converter is used which is clocked at 16 Hz. Subtraction of the digital reference value Ref (corresponding with a nominal phase value) from the digital value at the output of the analog-to-digital converter ADC produces a value whose resolution is increased to 16 bits by insertion of the oversample filter OF. The loop filter LF operating in the digital mode performs the same action an analog loop filter and is clocked in the exemplary embodiment at 1/16 of the second clock TA, i.e. at 1 Hz. In the exemplary embodiment the third clock TO corresponds with the second clock TAx. In another embodiment the second clock TA of the digital-to-analog converter DAC and the shift register SR is larger than the third clock TO of the analog-to-digital converter and the oversample filter OF. In the exemplary embodiment the fractionizer FR, which is also realized in software, forms the main value HW having a word length of 12 bits and the residual value RW having a word length of 4 bits from the output value LW of the loop filter having a word length of, for example, 24 bits. The remaining 8 bits are disregarded in the exemplary embodiment. The information of the residual value RW is processed, for example by means of a calculation process or, in accordance with the exemplary embodiment, the correction value KW obtained by applying the residual value RW as an address to the table look-up memory TAB of; this correction value KW has a word length of 16 bits. The number of binary bits having the value "one" in the correction value KW is equal to the weight of the residual value RW and advantageously the bit positions of the binary values "one" and "zero" are distributed as uniformly as possible. The 16 bits of the correction value KW formed at the clock TL are now loaded in parallel into the shift register SR also at the clock TL. Reading the individual correction bits KB of the correction value KW from the shift register SR, however, is performed at the clock TA (16 Hz) which, in the exemplary embodiment, corresponds with 16 times the clock TL of the loop filter LF. The correction bit KB and the main value HW are added together to produce the sum value SW. So far, that is to say, from the oversample filter OF up to and including the production of the sum value SW, the phase-locked loop can be realized in software. The inherent saving on hardware solutions leads to a cost effective implementation of the phase-locked loop. By the digital-to-analog converter DAC also operating at the clock TA the sum value SW is converted into an analog voltage $U_{vco}$ adjusting the oscillator VCO more often, that is to say, in the exemplary embodiment 16 times as often as would be the case without the correction value KW being formed. Consequently, the mean frequency $f_o$ at the output of the oscillator VCO, which is temperature controlled in the exemplary embodiment, is adjusted more closely to the frequency $f_i$ at the input of the phase-locked loop and thus the resulting phase jitter is reduced considerably.

With a further increase of the clock TA of the digital-to-analog converter DAC and of the shift register SR as well as an increase of the clock TO of the oversample filter OF or an enhancement of the calculation accuracy of the loop filter LF the hybrid phase-locked loop more and more shows the behavior of an analog phase-locked loop. In addition, in a free-running condition, that is to say, if the reference value Ref drops out, the mean frequency deviation of the oscillator VCO is substantially reduced because in this case the output value LW of the loop filter is retained nd processed into the sum value SW in the same way as described hereinbefore.

We claim:

1. Phase-locked loop comprising a phase detector, an analog-to-digital converter, a digital loop filter, a digital-to-analog converter and a voltage-controlled oscillator, characterized in that a fractionizer is inserted after the digital loop filter that is operating at a first clock, which fractionizer produces a main value and a residual value and in that means are provided for deriving a correction value from the residual value and for applying the sum of the main value and a correction bit derived from the correction value is applied to the digital-to-analog converter that is operating at a second clock.

2. Phase-locked loop as claimed in claim 1, characterized in that the correction bit is equal to one bit of the correction value that is applied to a shift register, and the correction bit is read out form the shift register at the second clock.

3. Phase-locked loop as claimed in claim 1, characterized in that the correction value has a word length corresponding with the ratio of the second clock of the digital-to-analog converter to the first clock of the digital loop filter, and in that the word length of the main value corresponds with the bit width of the digital-to-analog converter.

4. Phase-locked loop as claimed in claim 1, characterized in that an oversample filter is inserted between the ADC and the digital loop filter, both the analog-to-digital converter and the oversample filter operating a third clock.

5. Phase-locked loop as claimed in claim 1, characterized in that the correction value is obtained by applying the residual value as an address to a table look-up memory.

6. Phase-locked loop as claimed in claim 1, characterized in that the correction bit is formed by means of a calculation process.

7. Phase-locked loop as claimed in claim 1, characterized in that a low-pass filter is inserted after the phase detector.

8. Phase-locked loop as claimed in claim 4, characterized in that the second clock is equal to the third clock.

9. Phase-locked loop as claimed in claim 2, characterized in that the correction value has a word length corresponding with the ratio of the second clock of the digital-to-analog converter to the first clock of the digital loop filter, and in that the word length of the main value corresponds with the bit width of the digital-to-analog converter.

10. Phase-locked loop as claimed in claim 2, characterized in that an oversample filter is inserted between the analog-to-digital converter and the digital loop filter, both the analog-to-digital converter and the oversample filter operating at a third clock.

11. Phase-locked loop as claimed in claim 9, characterized in that an oversample filter is inserted between the analog-to-digital converter and the digital loop filter, both the analog-to-digital converter and the oversample filter operating at a third clock.

12. Phase-locked loop as claimed in claim 2, characterized in that the correction value is obtained by applying the residual value as an address to a table look-up memory.

13. Phase-locked loop as claimed in claim 9, characterized in that the correction value is obtained by applying the residual value as an address to a table look-up memory.

14. Phase-locked loop as claimed in claim 11, characterized in that the correction value is obtained by applying the residual value as an address to a table look-up memory.

15. Phase-locked loop as claimed in claim 2, characterized in that the correction bit is formed by means of a calculation process.

16. Phase-locked loop as claimed in claim 11, characterized in that the correction bit is formed by means of a calculation process.

17. Phase-locked loop as claimed in claim 2, characterized in that a low-pass filter is inserted after the phase detector.

18. Phase-locked loop as claimed in claim 16, characterized in that a low-pass filter is inserted after the phase detector.

19. Phase-locked loop as claimed in claim 10, characterized in that the second clock is equal to the third clock.

20. Phase-locked loop as claimed in claim 14, characterized in that the second clock is equal to the third clock.

* * * * *